(12) United States Patent
Kim et al.

(10) Patent No.: US 9,312,425 B2
(45) Date of Patent: Apr. 12, 2016

(54) CRACK RESISTANT SOLAR CELL MODULES

(71) Applicant: SunPower Corporation, San Jose, CA (US)

(72) Inventors: Sung Dug Kim, Pleasanton, CA (US); Nicholas Boitnott, San Francisco, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/688,794

(22) Filed: Apr. 16, 2015

(65) Prior Publication Data
US 2015/0221813 A1    Aug. 6, 2015

Related U.S. Application Data

(62) Division of application No. 13/685,441, filed on Nov. 26, 2012, now Pat. No. 9,035,172.

(51) Int. Cl.
| | |
|---|---|
| *H01L 31/048* | (2014.01) |
| *H01L 31/18* | (2006.01) |
| *B32B 27/32* | (2006.01) |
| *B32B 27/08* | (2006.01) |
| *B32B 27/30* | (2006.01) |
| *B32B 27/36* | (2006.01) |

(52) U.S. Cl.
CPC ............ *H01L 31/1876* (2013.01); *B32B 27/08* (2013.01); *B32B 27/304* (2013.01); *B32B 27/32* (2013.01); *B32B 27/322* (2013.01); *B32B 27/36* (2013.01); *B32B 27/365* (2013.01); *H01L 31/048* (2013.01); *H01L 31/0481* (2013.01); *H01L 31/18* (2013.01); *B32B 2307/412* (2013.01); *B32B 2457/00* (2013.01); *Y02B 10/12* (2013.01); *Y02E 10/50* (2013.01)

(58) Field of Classification Search
CPC .............. H01L 31/1876; H01L 31/048; H01L 31/0481; H01L 31/18; B32B 27/30; B32B 27/32
USPC .......................................... 136/251, 252, 256
See application file for complete search history.

(56) References Cited

U.S. PATENT DOCUMENTS

| | | | | |
|---|---|---|---|---|
| 5,043,375 A | * | 8/1991 | Henning | ................... C08J 7/047 524/372 |
| 2002/0020440 A1 | * | 2/2002 | Yoshimine | ........ B32B 17/10018 136/251 |

* cited by examiner

*Primary Examiner* — Susan D Leong
(74) *Attorney, Agent, or Firm* — Okamoto & Benedicto LLP

(57) ABSTRACT

A crack resistant solar cell module includes a protective package mounted on a frame. The protective package includes a polyolefin encapsulant that protectively encapsulates solar cells. The polyolefin has less than five weight percent of oxygen and nitrogen in the backbone or side chain. In other words, the combined weight percent of oxygen and nitrogen in any location in the molecular structure of the polyolefin is less than five. The polyolefin also has a complex viscosity less than 10,000 Pa second at 90° C. as measured by dynamic mechanical analysis (DMA) before any thermal processing of the polyolefin. The protective package includes a top cover, the encapsulant, and a backsheet. The solar cell module allows for shipping, installation, and maintenance with less risk of developing cracks on the surfaces of the solar cells.

20 Claims, 4 Drawing Sheets

CRACK RESISTANT SOLAR CELL MODULES

CROSS-REFERENCE TO RELATED APPLICATIONS

This application is a divisional of U.S. patent application Ser. No. 13/685,441, filed on Nov. 26, 2012, which is incorporated herein by reference in its entirety.

TECHNICAL FIELD

Embodiments of the subject matter described herein relate generally to solar cell modules. More particularly, embodiments of the subject matter relate to solar cell module structures and manufacturing processes.

BACKGROUND

Solar cells are well known devices for converting solar radiation to electrical energy. A solar cell has a front side that faces the sun during normal operation to collect solar radiation and a backside opposite the front side. Solar radiation impinging on the solar cell creates electrical charges that may be harnessed to power an external electrical circuit, such as a load.

Solar cells may be serially connected and packaged together to form a solar cell module. The packaging provides environmental protection for the solar cells. Prior to operation in the field, such as in a residential home, commercial structure, or photovoltaic power plant, solar cell modules may be subjected to rough handling during shipping, installation, and maintenance. Embodiments of the present invention pertain to solar cell modules with features that prevent cracks from developing on solar cells.

BRIEF SUMMARY

In one embodiment, a crack resistant solar cell module includes a protective package mounted on a frame. The protective package includes a polyolefin encapsulant that protectively encapsulates solar cells. The polyolefin has less than five weight percent of oxygen and nitrogen in the backbone or side chain. In other words, the combined weight percent of oxygen and nitrogen in any location in the molecular structure of the polyolefin is less than five. The polyolefin also has a complex viscosity less than 10,000 Pa second at 90° C. as measured by dynamic mechanical analysis (DMA) before any thermal processing (e.g., lamination) of the polyolefin. The protective package includes a top cover, the encapsulant, and a backsheet. The solar cell module allows for shipping, installation, and maintenance with less risk of developing cracks on the surfaces of the solar cells.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of components, materials, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
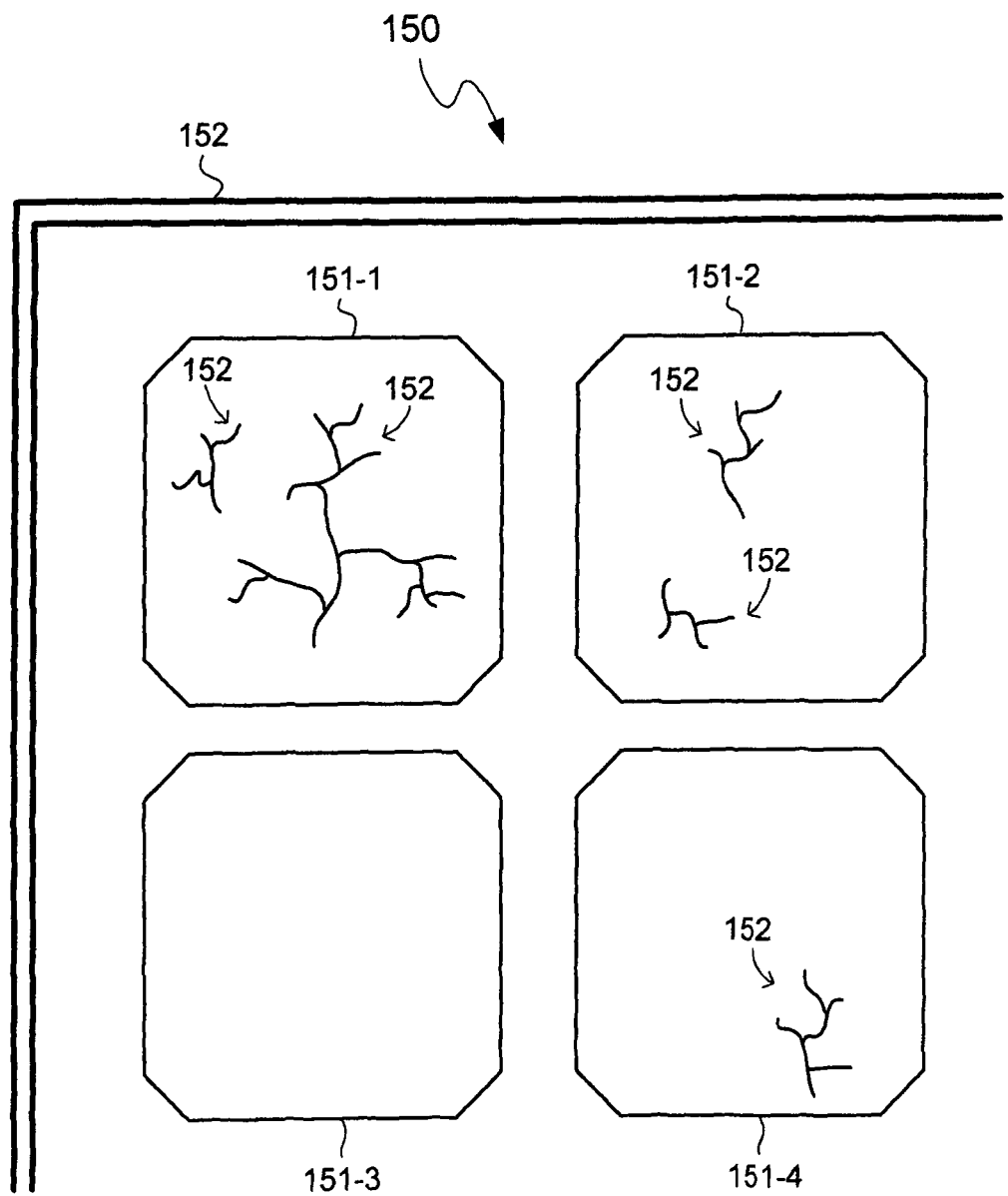
FIG. 1 schematically shows a plan view of a portion of an example solar cell module with fern cracks.

FIG. 1 schematically shows a plan view of a portion of an example solar cell module 150 with fern cracks. The solar cell module 150 includes a plurality of solar cells 151 (i.e., 151-1, 151-2, 151-3, 151-4, etc.) that are mounted on a frame 152. There are many solar cell modules 151 in the solar cell module 150, but only some on the upper left corner are shown for clarity of illustration.

In general, solar cell modules are shipped from their source, such as a warehouse or factory, to the job site where the solar cell modules will be installed and operated. The solar cell modules may be subjected to rough handling as they are loaded and unloaded during shipment. At the job site, the solar cell modules may be subjected to further rough handling before or during installation and during maintenance. For example, prior to installation, the solar cell modules may be left on the floor where they may be stepped on by installers and other workers. Some installers may also ignore proper handling instructions.

In the example of FIG. 1, some of the solar cells 151 have fern cracks 152. The fern cracks 152 may be caused by rough handling and repeated mechanical stress in the field. The fern cracks 152 are so named because they usually, but not necessarily, branch out and extend on the surface of the damaged solar cell 151. In the example of FIG. 1, the solar cells 151-1, 151-2, and 151-4 (but not the solar cell 151-3) have fern cracks 152. The fern cracks 152 may induce hot solar cells and may result in power loss.

Figure 2:
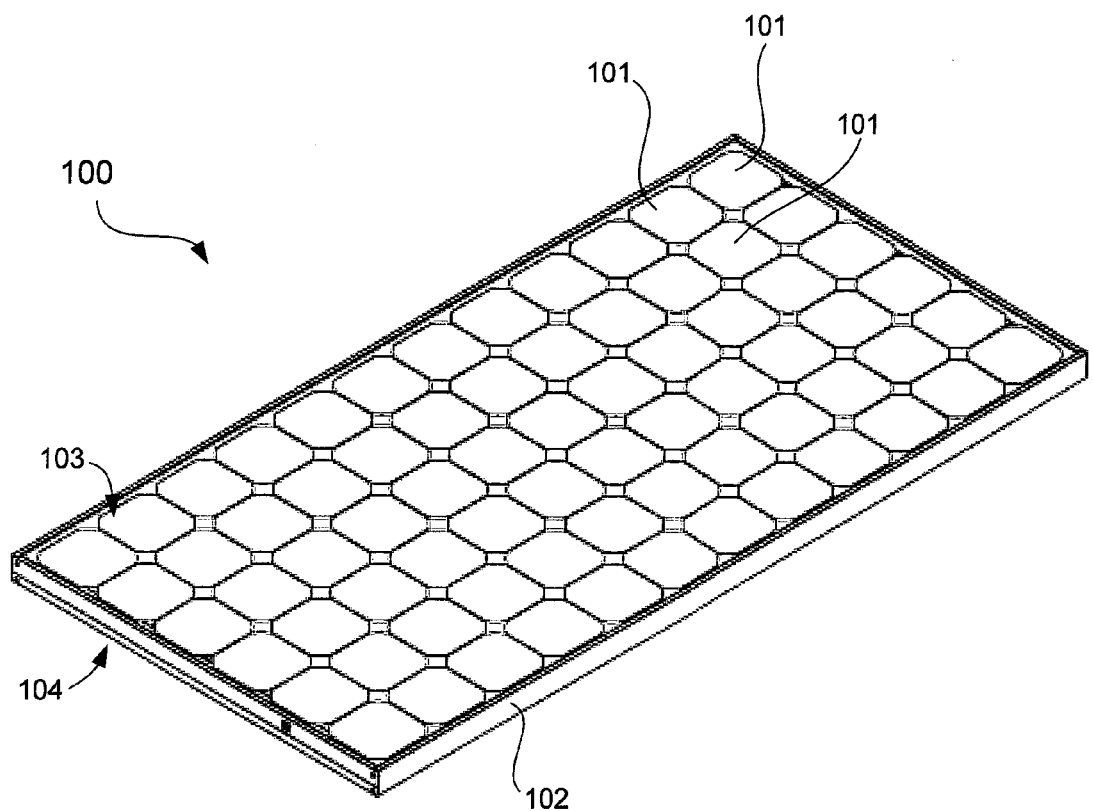
FIG. 2 shows a perspective view of a solar cell module in accordance with an embodiment of the present invention.

Referring now to FIG. 2, there is shown a perspective view of a solar cell module 100 in accordance with an embodiment of the present invention. The solar cell module 100 is a so-called "terrestrial solar cell module" in that it is designed for use in stationary applications, such as on rooftops or by photovoltaic power plants. In the example of FIG. 2, the solar cell module 100 includes an array of interconnected solar cells 101. Only some of the solar cells 101 are labeled in FIG. 2 for clarity of illustration. In the example of FIG. 2, the solar cells 101 comprise backside contact solar cells. In a backside contact solar cell, all diffusion regions and metal contacts coupled to the diffusion regions are formed on the backside of the solar cell. That is, both the P-type and N-type diffusion regions and metal contacts coupled to them are on the backside of the solar cell. In other embodiments, the solar cells 101 comprise front contact solar cells where one polarity of diffusion regions (e.g., N-type diffusion regions) are on the front side of the solar cells, and the opposite polarity of diffusion regions (e.g., P-type diffusion regions) are on the backside of the solar cells.

Visible in FIG. 2 are the front sides of the solar cells 101. The front sides of the solar cells 101 are also referred to as the "sun side" because they face towards the sun during normal operation. The backsides of the solar cells 101 are opposite the front sides. A frame 102 provides mechanical support for the solar cells 101. The front portion 103 of the solar cell module 100 is on the same side as the front sides of the solar cells 101 and is visible in FIG. 2. The back portion 104 of the solar cell module 100 is under the front portion 103. The back portion 104 of the solar cell module 100 is on the same side as the backsides of the solar cells 101.

Figure 3:
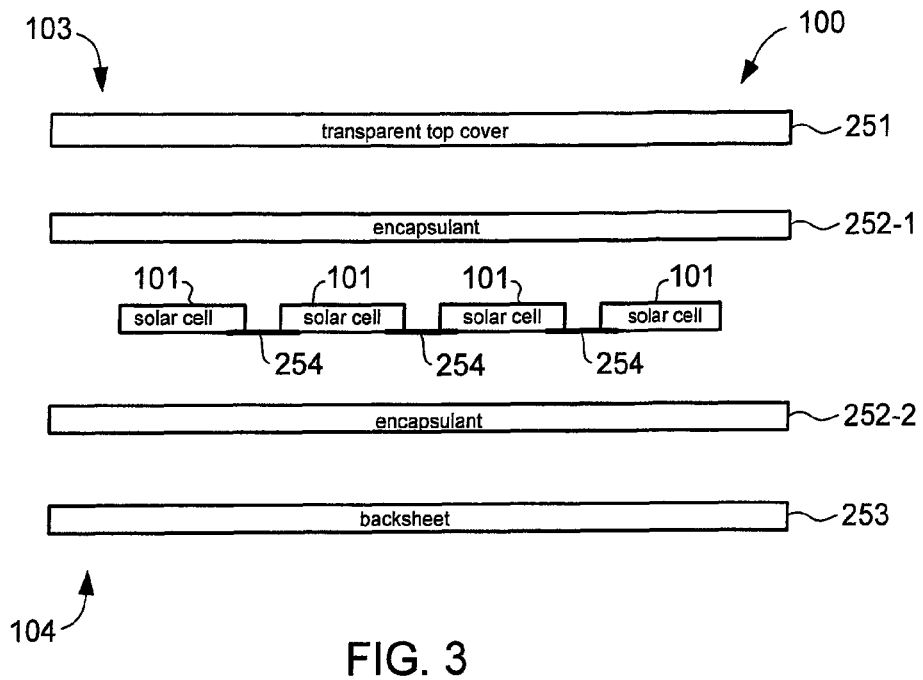
FIGS. 3-5 are cross-sectional views schematically illustrating a method of making a solar cell module in accordance with an embodiment of the present invention.
Figure 4:
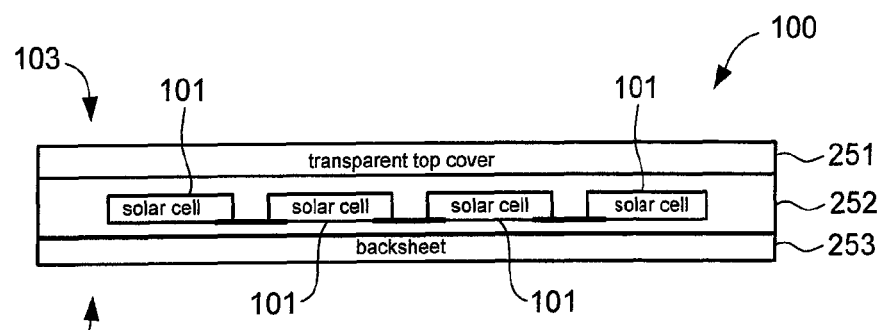
Figure 5:
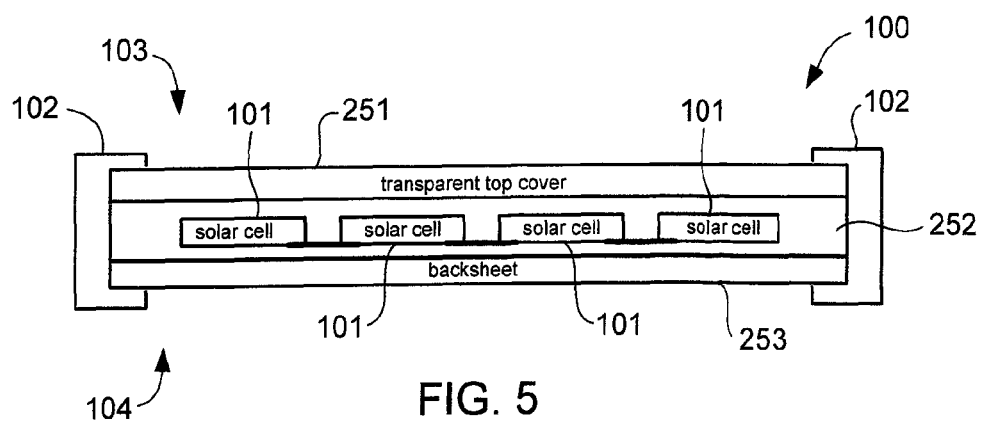

FIGS. 3-5 are cross-sectional views schematically illustrating a method of making a solar cell module 100 in accordance with an embodiment of the present invention.

FIG. 3 is an exploded view showing the components of the solar cell module 100 in accordance with an embodiment of the present invention. The solar cell module 100 may comprise a transparent top cover 251, sheets of encapsulant 252, the solar cells 101, interconnects 254, and a backsheet 253. The sheet of encapsulant 252 on the front portion 103 is labeled as "252-1" and the sheet of encapsulant 252 on the back portion 104 is labeled as "252-2." The transparent top cover 251 and the front side encapsulant 252-1 serve as front side packaging components, and the backside encapsulant 252-2 and the backsheet 253 serve as backside packaging components. In the example of FIG. 3, the transparent top cover 251 is the outermost front side packaging component and the backsheet 253 is the outermost backside packaging component.

The transparent top cover 251 and the encapsulant 252 comprise optically transparent materials. The transparent top cover 251, which is the topmost layer on the front portion 103, protects the solar cells 101 from the environment. The solar cell module 100 is installed in the field such that the transparent top cover 251 faces the sun during normal operation. The front sides of the solar cells 101 face towards the sun by way of the transparent top cover 101. In the example of FIG. 3, the transparent top cover 201 comprises glass (e.g., 3.2 mm thick, soda lime glass).

The encapsulant 252 protectively encapsulates the solar cells 101. The inventors discovered that there is a correlation between fern cracks and the type of encapsulant employed. At the material level, the inventors also discovered that the viscosity of the encapsulant is critical to control the degree or severity of the fern crack. These discoveries are unexpected in that the characteristics of the encapsulant, instead of the solar cells themselves, need to be addressed to mitigate fern cracks on the solar cells. In embodiments of the present invention, the characteristics of the encapsulant 252 are optimized to reduce occurrence of fern cracks on the solar cells 101.

In one embodiment, the encapsulant 252 comprises polyolefin. Examples of suitable polyolefin include polyethylene, high density polyethylene, low density polyethylene, linear low density polyethylene, and polypropylene. In one embodiment, to guard against fern cracks, the encapsulant 252 comprises polyolefin that has less than 5 weight percent of oxygen and nitrogen in the backbone or side chain. In other words, the combined weight percent of oxygen and nitrogen in any location in the molecular structure of the polyolefin is less than five. In one embodiment, the polyolefin further has a complex viscosity less than 10,000 Pa-s (Pascal second) at 90° C. as measured by dynamic mechanical analysis (DMA) before lamination or any other thermal processing. The volume resistivity of the polyolefin of the encapsulant 252 is preferably at least $10^{15}$ Ohm-cm as measured by ASTM D257 test at 1 kV, 10 min electrification, and 60° C. As is well known, ASTM D257 is a standard by ASTM International, which is formerly known as the American Society for Testing and Materials.

The interconnects 254 may comprise a metal for electrically interconnecting the solar cells 101. In the example of FIG. 3, the solar cells 101 comprise serially-connected backside contact solar cells, and the interconnects 254 electrically connect to corresponding P-type and N-type diffusion regions on the backsides of the solar cells 101. The solar cells 101 may also comprise serially-connected front contact solar cells, in which case the interconnects 254 would connect to diffusion regions on the backside and front side of the solar cells.

The backsides of the solar cells 101 face the backsheet 253. The backsheet 253 may be any single layer or multiple layers of materials that provide environmental protection to other components of the solar cell module 100. For example, flouropolymer, polyvinylidene fluoride, polytetrafluoroethylene, polypropylene, polyphenylene sulfide, polyester, polycarbonate, or polyphenylene oxide may be used as a single layer or as part of multiple layers of backsheet. The backsheet 253 is on the back portion 104.

In one embodiment, the transparent top cover 251, the encapsulant 252-1 on the front side, the solar cells 101 electrically connected by the interconnects 254, the encapsulant 252-2 on the backside, and the backsheet 253 are formed together to create a protective package. This is illustrated in FIG. 4, where the aforementioned components are formed together in the stacking order of FIG. 3. More particularly, the solar cells 101 are placed between the encapsulants 252-1 and 252-2, the backsheet 253 is placed under the encapsulant 252-2, and the transparent top cover 251 is placed over the encapsulant 252-1. The just mentioned components are then pressed and heated together by vacuum lamination, for example. The lamination process melts together the sheet of encapsulant 252-1 and the sheet of encapsulant 252-2 to encapsulate the solar cells 101. In FIG. 4, the encapsulant 252-1 and the encapsulant 252-2 are simply labeled as "252" to indicate that that they have been melted together.

FIG. 5 shows the protective package of FIG. 4 mounted on the frame 102. Being encapsulated in the encapsulant 252, the solar cells 101 are electrically isolated from the frame 102.

Tables 1, 2, and 3 discussed below show the effectiveness of the above disclosed encapsulants in preventing fern cracks.

Table 1 shows the complex viscosity of various polyolefin encapsulants (Sample 1, Sample 2, Sample 3, and Sample 4) at various temperatures measured at 1/s shear rate by dynamic mechanical analysis. Table 1 shows complex viscosity in Pascal second (Pa-s). The viscosities were measured before any thermal processing of the encapsulants, which in this example is before lamination.

TABLE 1

| Temperature (° C.) | Sample 1 | Sample 2 | Sample 3 | Sample 4 |
| --- | --- | --- | --- | --- |
| 50  | 7.0E+04 | 8.3E+04 | 9.5E+03 | 8.4E+04 |
| 90  | 2.9E+04 | 4.1E+04 | 2.4E+03 | 7.3E+03 |
| 130 | 1.6E+04 | 4.7E+03 | 1.6E+03 | 2.3E+03 |
| 140 | 1.5E+04 | 4.3E+03 | 1.5E+03 | 2.3E+03 |
| 150 | 1.3E+04 | 3.3E+03 | 1.5E+03 | 2.3E+03 |

As shown in Table 1, the polyolefin encapsulants referred to as "Sample 3" and "Sample 4" have a complex viscosity less than 10,000 Pa-s at 90° C. Samples 3 and 4 have the characteristics of encapsulants in accordance with embodiments of the present invention. The polyolefin encapsulants referred to as "Sample 1" and "Sample 2" have complex viscosities greater than 10,000 Pa-s at 90° C., and therefore do not have the characteristics for preventing fern cracks.

Table 2 shows the relative probability of developing fern cracks on the solar cells when using the above-noted samples of polyolefin encapsulants. More particularly, as noted in Table 2, studies performed by the inventors indicate that solar cells encapsulated by Sample 1 are four times more likely to develop cracks compared to solar cells encapsulated by Sample 3. Similarly, solar cells encapsulated by Sample 2 are three times more likely to develop cracks compared to solar cells encapsulated by Sample 3.

TABLE 2

| | Relative Probability of Cracking Cell |
|---|---|
| Sample 1 | 4x |
| Sample 2 | 3x |
| Sample 3 | 1x (baseline) |

Table 3 shows relative power degradation of solar cells encapsulated by Sample 2, Sample 3, and Sample 4 in a stress test where a person stepped on the solar cell modules. The stress test simulates foot traffic during installation or cleaning process in the field. A person weighing 85 kg stepped on all of the solar cells of the module in the first test. In a second test, a person weighing 120 kg stepped on all of the solar cells of the module.

TABLE 3

| | Relative power degradation for 85 kg person stepping on solar cell module | Relative power degradation for 120 kg person stepping on solar cell module |
|---|---|---|
| Sample 2 | 5.7x | 15x |
| Sample 3 | 1x (baseline) | 1x (baseline) |
| Sample 4 | 0.6x | 0.6x |

As shown in Table 3, solar cells encapsulated by Sample 2 exhibited much higher power degradation compared to solar cells encapsulated by either Sample 3 or Sample 4. The difference in relative power degradation of the solar cells increased when a heavier person walked on the solar cell modules.

Figure 6:
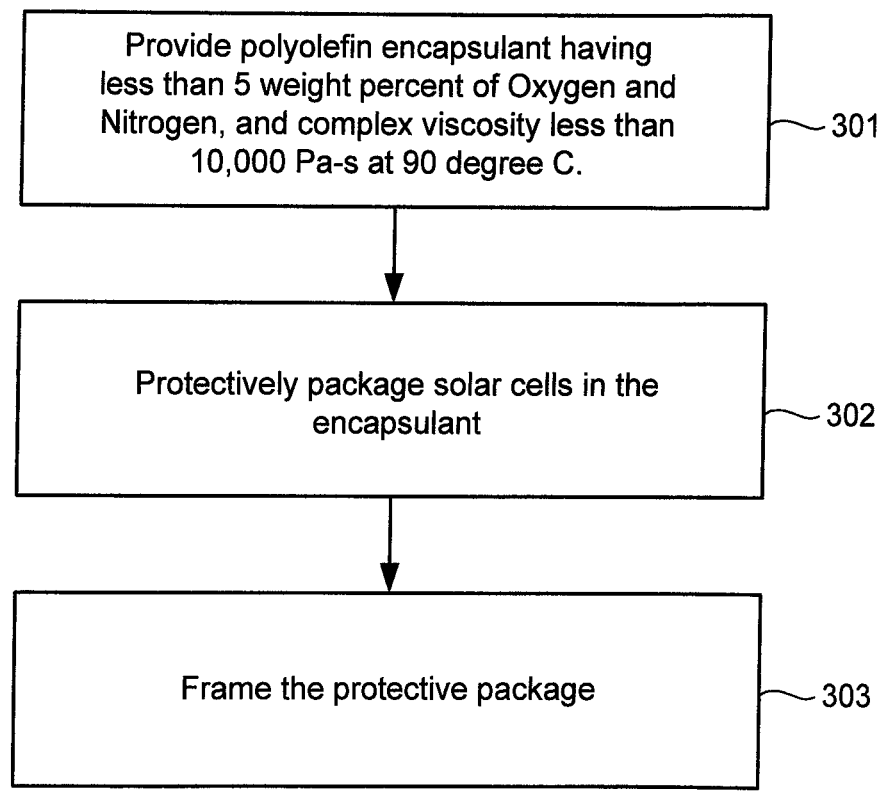
FIG. 6 shows a flow diagram of a method manufacturing a solar cell module in accordance with an embodiment of the present invention.

FIG. 6 shows a flow diagram of a method of manufacturing a solar cell module in accordance with an embodiment of the present invention. The method of FIG. 6 includes providing an encapsulant for a solar cell module (step 301). In one embodiment, the encapsulant comprises polyolefin having less than five weight percent of oxygen and nitrogen in the backbone or side chain, and having a complex viscosity that is less than 10,000 Pascal second at 90° C. as measured by dynamic mechanical analysis before lamination or any thermal processing. The polyolefin encapsulant may also have a volume resistivity of at least $10^{15}$ Ohm-cm as measured by ASTM D257 test at 1 kV, 10 min. electrification, and 60° C.

Solar cells to be included in the solar cell module are protectively packaged in the encapsulant (step 302). In one embodiment, the solar cells are placed between sheets (e.g., a bottom sheet and a top sheet) of the encapsulant, a backsheet is placed under a bottom sheet of the encapsulant, and a transparent top cover is placed over a top sheet of the encapsulant. The transparent top cover, the solar cells sandwiched by the sheets of the encapsulant, and the backsheet are then pressed and heated together by vacuum lamination, for example. The resulting protective package is then mounted on a frame (step 303). The manufactured solar cell module is resistant to fern cracks, reducing the chance of damaging the solar cells contained therein during shipping, installation, and maintenance.

Crack resistant solar cell modules and method of manufacturing same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of manufacturing a solar cell module, the method comprising:
   providing an encapsulant for a solar cell module, the encapsulant comprising polyolefin having less than five weight percent of oxygen and nitrogen in a backbone or side chain and having a complex viscosity that is less than 10,000 Pascal second at 90° C. as measured by dynamic mechanical analysis before protectively packaging a plurality of solar cells in the encapsulant to create a protective package;
   protectively packaging the plurality of solar cells in the encapsulant to create the protective package; and
   mounting the protective package on a frame.

2. The method of claim 1, wherein the polyolefin has a volume resistivity of at least $10^{15}$ Ohm-cm as measured by ASTM D257 test at 1 kV, 10 min electrification, and 60° C.

3. The method of claim 1, wherein the plurality of solar cells comprises backside contact solar cells.

4. The method of claim 1, wherein the polyolefin comprises polyethylene.

5. The method of claim 1, wherein the polyolefin comprises polypropylene.

6. The method of claim 1, wherein protectively packaging the plurality of solar cells in the encapsulant to create the protective package comprises:
   placing the plurality of solar cells between a top sheet and a bottom sheet of the encapsulant;
   placing a backsheet under the bottom sheet of the encapsulant;
   placing a transparent top cover over the top sheet of the encapsulant; and
   pressing and heating together the top sheet of the encapsulant, the bottom sheet of the encapsulant, the top cover, and the backsheet.

7. The method of claim 6, wherein the top and bottom sheets of the encapsulant, the top cover, and the backsheet are pressed and heated together by vacuum lamination.

8. A method of manufacturing a solar cell module, the method comprising:
   placing a plurality of solar cells between sheets of an encapsulant that comprises polyolefin having less than 5 weight percent oxygen and nitrogen in a backbone or side chain;
   forming a protective package by heating the sheets of the encapsulant to encapsulate the plurality of solar cells; and
   mounting the protective package on a frame.

9. The method of claim 8, wherein the polyolefin has a complex viscosity less than 10,000 Pa-s at 90° C. as measured by dynamic mechanical analysis before any heating of the encapsulant.

10. The method of claim 8, wherein the polyolefin has a volume resistivity of at least $10^{15}$ Ohm-cm as measured by ASTM D257 test at 1 kV, 10 min electrification, and 60° C.

11. The method of claim 8, wherein forming the protective package comprises:
placing a bottom sheet of the encapsulant over a backsheet;
placing a transparent top cover over a top sheet of the encapsulant; and
heating the transparent top cover, the top and bottom sheets of the encapsulant, and the backsheet.

12. The method of claim 11, wherein the transparent top cover, the top and bottom sheets of the encapsulant, and the backsheet are heated to form the protective package in a lamination process.

13. The method of claim 8, wherein the polyolefin comprises polyethylene.

14. The method of claim 8, wherein the polyolefin comprises polypropylene.

15. A method of manufacturing a solar cell module, the method comprising:
forming a protective package by encapsulating a plurality of solar cells in an encapsulant that comprises polyolefin having less than 5 weight percent oxygen and nitrogen in a backbone or side chain, wherein the encapsulant has a complex viscosity that is less than 10,000 Pascal second at 90° C. as measured by dynamic mechanical analysis before forming the protective package; and
mounting the protective package on a frame.

16. The method of claim 15, wherein the polyolefin has a volume resistivity of at least $10^{15}$ Ohm-cm as measured by ASTM D257 test at 1 kV, 10 min electrification, and 60° C.

17. The method of claim 15, wherein forming the protective package comprises:
placing a bottom sheet of the encapsulant over a backsheet;
placing a transparent top cover over a top sheet of the encapsulant; and
heating the transparent top cover, the top and bottom sheets of the encapsulant, and the backsheet.

18. The method of claim 17, wherein the transparent top cover, the top and bottom sheets of the encapsulant, and the backsheet are heated to form the protective package in a lamination process.

19. The method of claim 15, wherein the polyolefin comprises polyethylene.

20. The method of claim 15, wherein the polyolefin comprises polypropylene.

* * * * *